US010682675B2

(12) United States Patent
Magee et al.

(10) Patent No.: US 10,682,675 B2
(45) Date of Patent: Jun. 16, 2020

(54) ULTRASONIC LENS CLEANING SYSTEM WITH IMPEDANCE MONITORING TO DETECT FAULTS OR DEGRADATION

(71) Applicant: Texas Instruments Incorporated, Dallas, TX (US)

(72) Inventors: David Patrick Magee, Allen, TX (US); Stephen John Fedigan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 131 days.

(21) Appl. No.: 15/497,624

(22) Filed: Apr. 26, 2017

(65) Prior Publication Data
US 2018/0117642 A1    May 3, 2018

Related U.S. Application Data

(60) Provisional application No. 62/415,554, filed on Nov. 1, 2016.

(51) Int. Cl.
| | | |
|---|---|---|
| *B08B 7/02* | (2006.01) | |
| *G01H 1/00* | (2006.01) | |
| *B06B 1/02* | (2006.01) | |
| *G02B 27/00* | (2006.01) | |

(Continued)

(52) U.S. Cl.
CPC ............ *B08B 7/028* (2013.01); *B06B 1/0284* (2013.01); *G01H 1/00* (2013.01); *G02B 27/0006* (2013.01); *H01L 41/042* (2013.01); *B60S 1/56* (2013.01)

(58) Field of Classification Search
CPC ..... B08B 7/028; B06B 1/0284; H01L 41/042; G02B 27/006
See application file for complete search history.

(56) References Cited

U.S. PATENT DOCUMENTS

| 3,681,626 A | 8/1972 | Puskas |
| 4,019,073 A | 4/1977 | Vishnevsky et al. |
| 4,271,371 A | 6/1981 | Furuichi et al. |

(Continued)

FOREIGN PATENT DOCUMENTS

| EP | 1703062 | 9/2006 |
| EP | 2479595 A1 | 7/2012 |

(Continued)

OTHER PUBLICATIONS

Graff, "Wave Motion in Elastic Solids", Dover, 1991, 3 pgs.

(Continued)

*Primary Examiner* — Sharidan Carrillo
(74) *Attorney, Agent, or Firm* — Michael A. Davis, Jr.; Charles A. Brill; Frank D. Cimino

(57) ABSTRACT

Lens cleaning systems, drivers and methods to detect faults or degradation in a lens cleaning system, including a controller to control a lens transducer drive signal frequency to vibrate the lens in a frequency range of interest and measure frequency response values according to driver feedback signals, and to compare the measured frequency response values to baseline frequency response values for a healthy system, and to selectively determine the existence of a fault or degradation in the lens cleaning system according to dissimilarities between the measured frequency response values and the baseline frequency response values.

13 Claims, 7 Drawing Sheets

(51) Int. Cl.
  *H01L 41/04* (2006.01)
  *B60S 1/56* (2006.01)

(56) References Cited

U.S. PATENT DOCUMENTS

| | | |
|---|---|---|
| 4,556,467 A | 12/1985 | Kuhn et al. |
| 4,607,652 A | 8/1986 | Yung |
| 4,691,725 A | 9/1987 | Parisi |
| 4,710,233 A | 12/1987 | Hohmann et al. |
| 4,836,684 A | 6/1989 | Javorik et al. |
| 4,852,592 A | 8/1989 | DeGangi et al. |
| 4,870,982 A | 10/1989 | Liu |
| 5,005,015 A | 4/1991 | Dehn et al. |
| 5,071,776 A | 12/1991 | Matsushita et al. |
| 5,113,116 A | 5/1992 | Wilson |
| 5,178,173 A | 1/1993 | Erickson et al. |
| 5,853,500 A | 12/1998 | Joshi et al. |
| 6,064,259 A | 5/2000 | Takita |
| 6,607,606 B2 | 8/2003 | Bronson |
| 7,705,517 B1 | 4/2010 | Koen et al. |
| 8,286,801 B2 | 10/2012 | Youngs |
| 8,293,026 B1 | 10/2012 | Bodor et al. |
| 8,494,200 B2 | 7/2013 | Ram |
| 8,899,761 B2 | 12/2014 | Tonar et al. |
| 9,070,856 B1 | 6/2015 | Rose et al. |
| 9,080,961 B2 | 7/2015 | Adachi |
| 9,084,053 B2 | 7/2015 | Parkins |
| 9,095,882 B2 | 8/2015 | Shimada et al. |
| 9,226,076 B2 | 12/2015 | Lippert et al. |
| 9,253,297 B2 | 2/2016 | Abe et al. |
| 9,573,165 B2 | 2/2017 | Weber |
| 2006/0285108 A1 | 12/2006 | Morrisroe |
| 2007/0046143 A1 | 3/2007 | Blandino |
| 2007/0159422 A1 | 7/2007 | Blandino |
| 2008/0198458 A1 | 8/2008 | Kashiyama |
| 2008/0248416 A1 | 10/2008 | Norikane |
| 2010/0171872 A1 | 7/2010 | Okano |
| 2011/0073142 A1 | 3/2011 | Hattori et al. |
| 2013/0170685 A1 | 7/2013 | Oh |
| 2013/0242481 A1 | 9/2013 | Kim |
| 2013/0333978 A1 | 12/2013 | Abe |
| 2014/0033454 A1 | 2/2014 | Koops et al. |
| 2014/0218877 A1 | 8/2014 | Wei |
| 2014/0253150 A1 | 9/2014 | Menzel |
| 2015/0277100 A1 | 10/2015 | Novoselov |
| 2016/0266379 A1* | 9/2016 | Li .................. G02B 27/0006 |
| 2017/0361360 A1 | 12/2017 | Li et al. |
| 2018/0085784 A1 | 3/2018 | Fedigan |
| 2018/0085793 A1 | 3/2018 | Fedigan |
| 2018/0117642 A1* | 5/2018 | Magee .................. B06B 1/0284 |
| 2018/0239218 A1 | 8/2018 | Ikeuchi et al. |
| 2018/0264526 A1 | 9/2018 | Kim |
| 2018/0275397 A1 | 9/2018 | Chung et al. |
| 2018/0304282 A1 | 10/2018 | Cook |
| 2018/0304318 A1 | 10/2018 | Revier |
| 2018/0326462 A1 | 11/2018 | Revier |
| 2019/0277787 A1 | 9/2019 | Chung et al. |

FOREIGN PATENT DOCUMENTS

| | | |
|---|---|---|
| EP | 2777579 B1 | 4/2015 |
| EP | 2873572 A1 | 5/2015 |
| JP | 2009283069 A | 12/2009 |
| JP | 5608688 A | 10/2014 |
| KR | 20130076250 A | 7/2013 |
| WO | 2007005852 A2 | 1/2007 |
| WO | 2010104867 A1 | 9/2010 |
| WO | 2018207041 | 11/2018 |

OTHER PUBLICATIONS

Hagedorn et al., "Travelling Wave Ultrasonic Motors, Part I: Working Principle and Mathematical Modelling of the Stator", Journal of Sound and Vibration, 1992, 155(1), pp. 31-46.

International Search Report for PCT Application No. PCT/US2018/016714, dated Jun. 21, 2018 (2 pages).

International Search Report for PCT/US2017/064530 dated Apr. 5, 2018.

Howard, "High speed photography of ultrasonic atomization," Thesis, Brown University, May 13, 2010 (39 pages).

Ziaei-Moayyed et al., "Electrical Deflection of Polar Liquid Streams: A Misunderstood Demonstration," Journal of Chemical Education, vol. 77, No. 11, Nov. 2000 (4 pages).

U.S. Appl. No. 15/492,315, entitled "Methods and Apparatus for Ultrasonic Lens Cleaner Using Configurable Filter Banks," filed Apr. 20, 2017 (63 pages).

U.S. Appl. No. 15/492,286, entitled "Methods and Apparatus Using Multistage Ultrasonic Lens Cleaning for Improved Water Removal," filed Apr. 20, 2017 (62 pages).

U.S. Appl. No. 15/492,433, entitled "Methods and Apparatus for Surface Wetting Control," filed Apr. 20, 2017 (46 pages).

U.S. Appl. No. 15/492,395, entitled "Methods and Apparatus for Electrostatic Control of Expelled Material from Lens Cleaners," filed Apr. 20, 2017 (28 pages).

International Search Report for PCT/US2017/059536 dated Feb. 28, 2018.

Vaseiljev, "Ultrasonic system for solar panel cleaning", Sensors and Actuators A, vol. 200, Oct. 1, 2013, pp. 74-78.

Kazemi, "Substrate cleaning using ultrasonics/megasonics," 2011 IEEE/Semi Advanced Semiconductor Manufacturing Conference, Saratoga Springs, NY, 2011, pp. 1-6.

Brereton, "Particle Removal by Focused Ultrasound", Journal of Sound and Vibration vol. 173, Issue 5, Jun. 23, 1994, pp. 683-698.

Gale, "Removal of Particulate Contaminants using Ultrasonics and Megasonics: A Review", Particulate Science and Technology, 1994, 13:3-4, 197-211.

Lee, "Smart self-cleaning cover glass for automotive miniature cameras," 2016 IEEE 29th International Conference on Micro Electro Mechanical Systems (MEMS), Shanghai, 2016, pp. 83-86.

Extended European Search Report for 17866470.2 dated Oct. 8, 2019.

Extended European Search Report for 17878085.4 dated Nov. 22, 2019.

Partial Supplementary European Search Report for 18747814.4 dated Jan. 30, 2020.

* cited by examiner

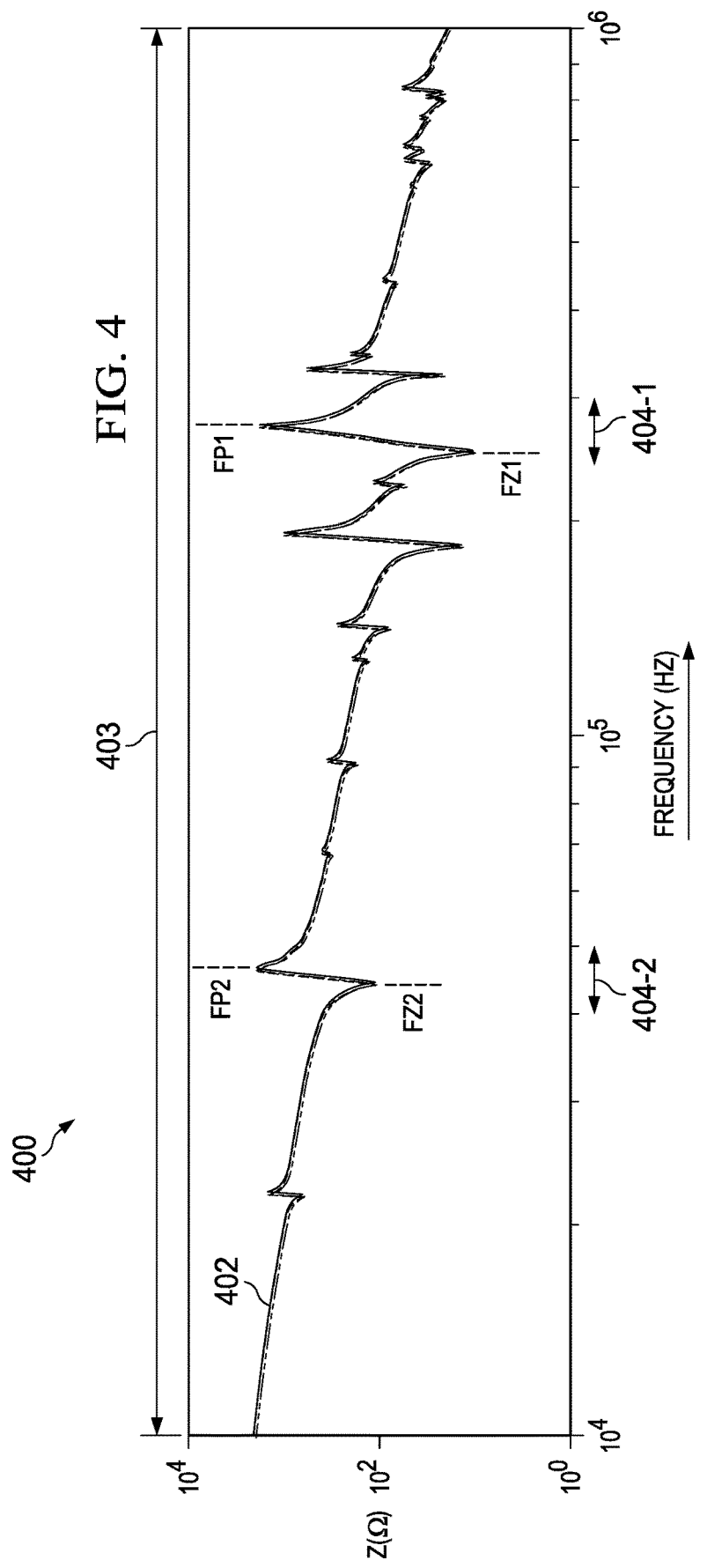

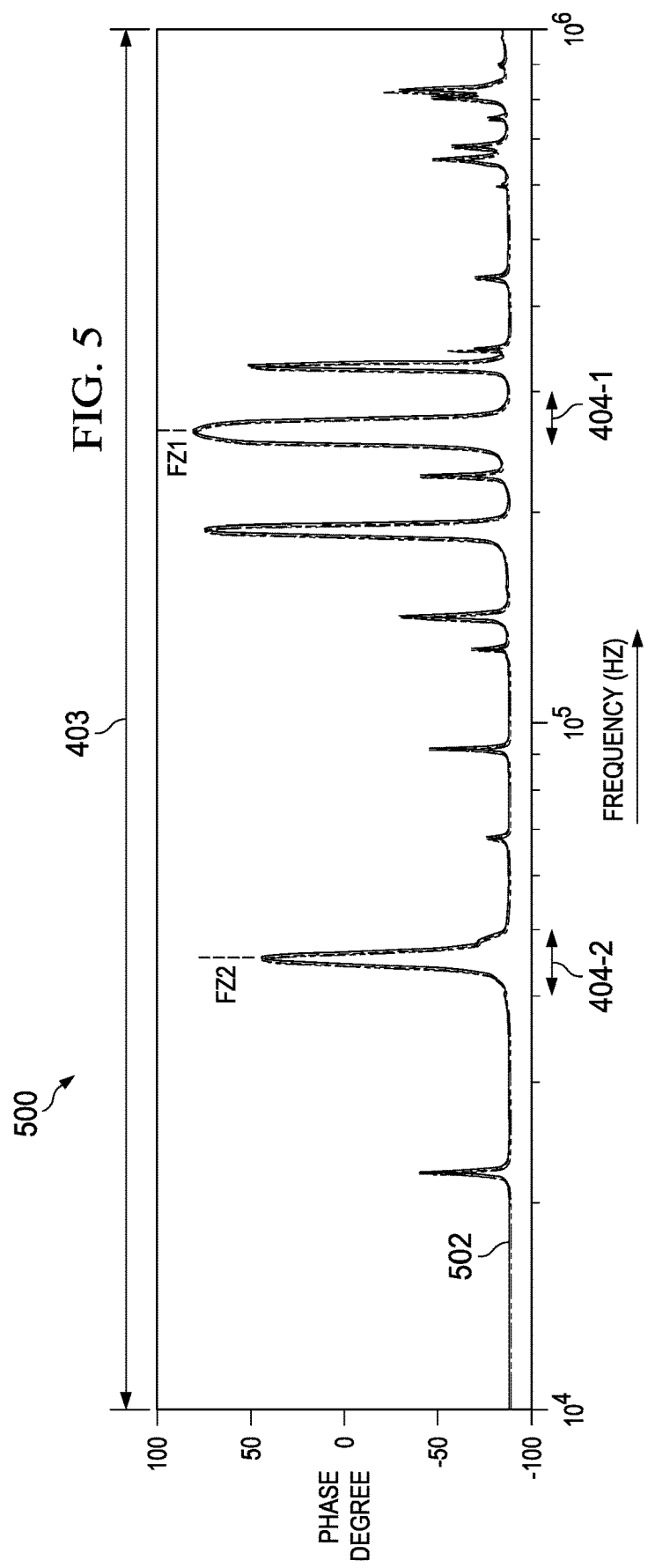

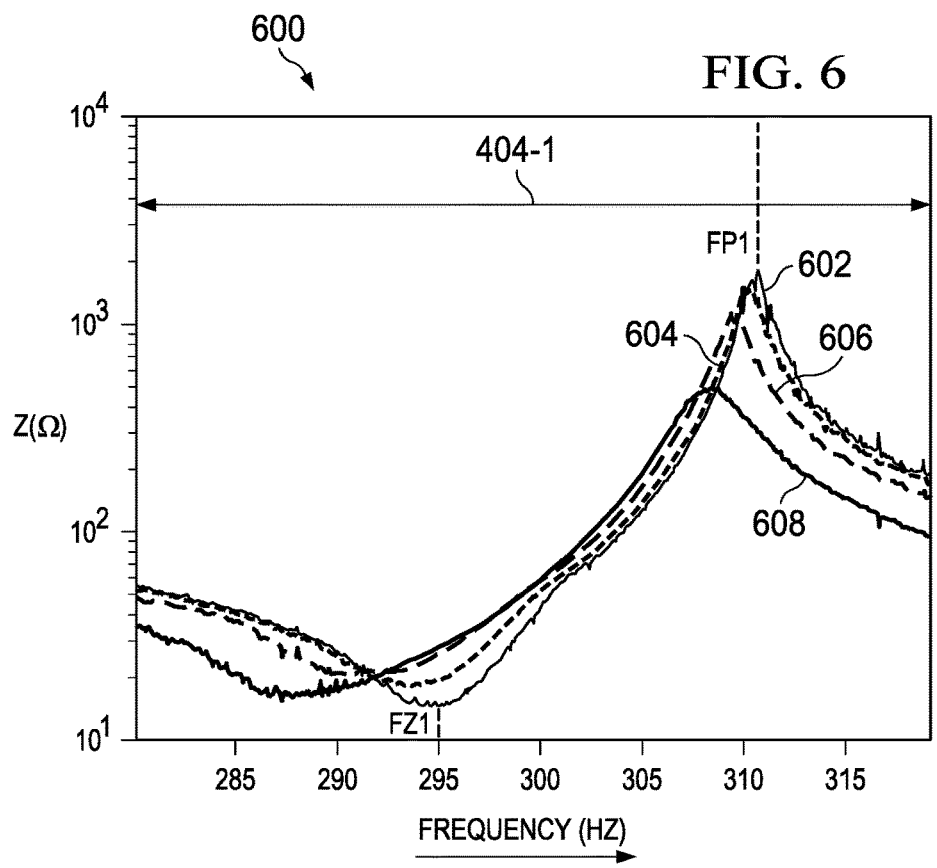
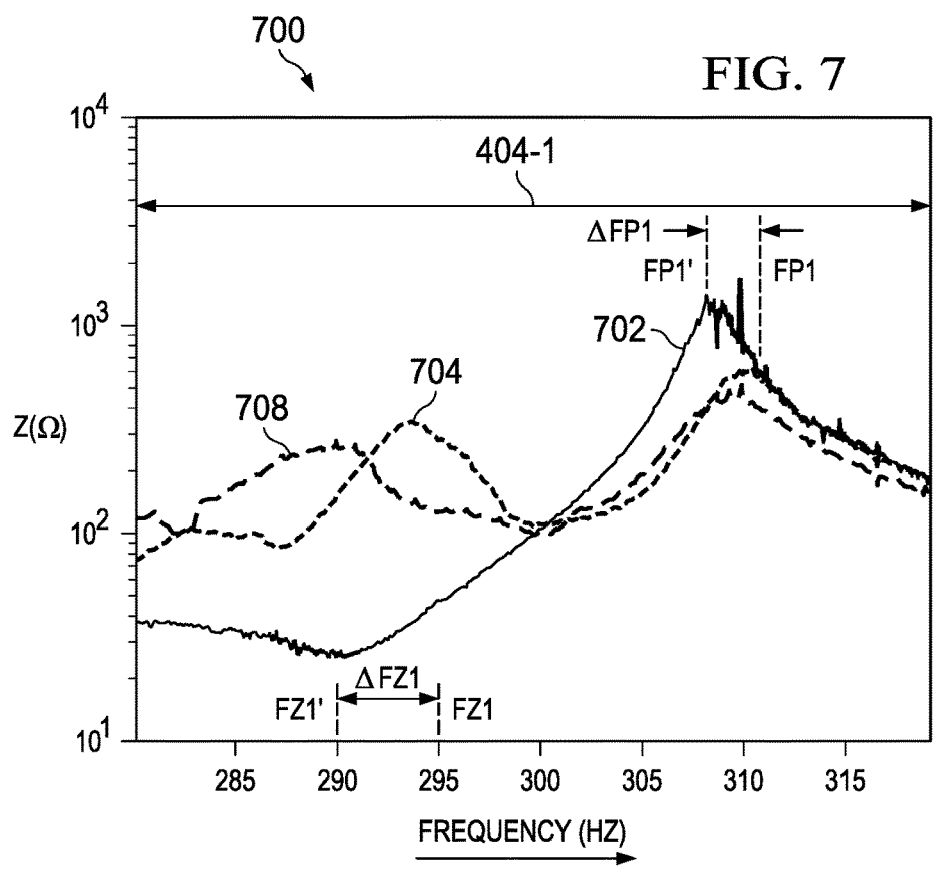

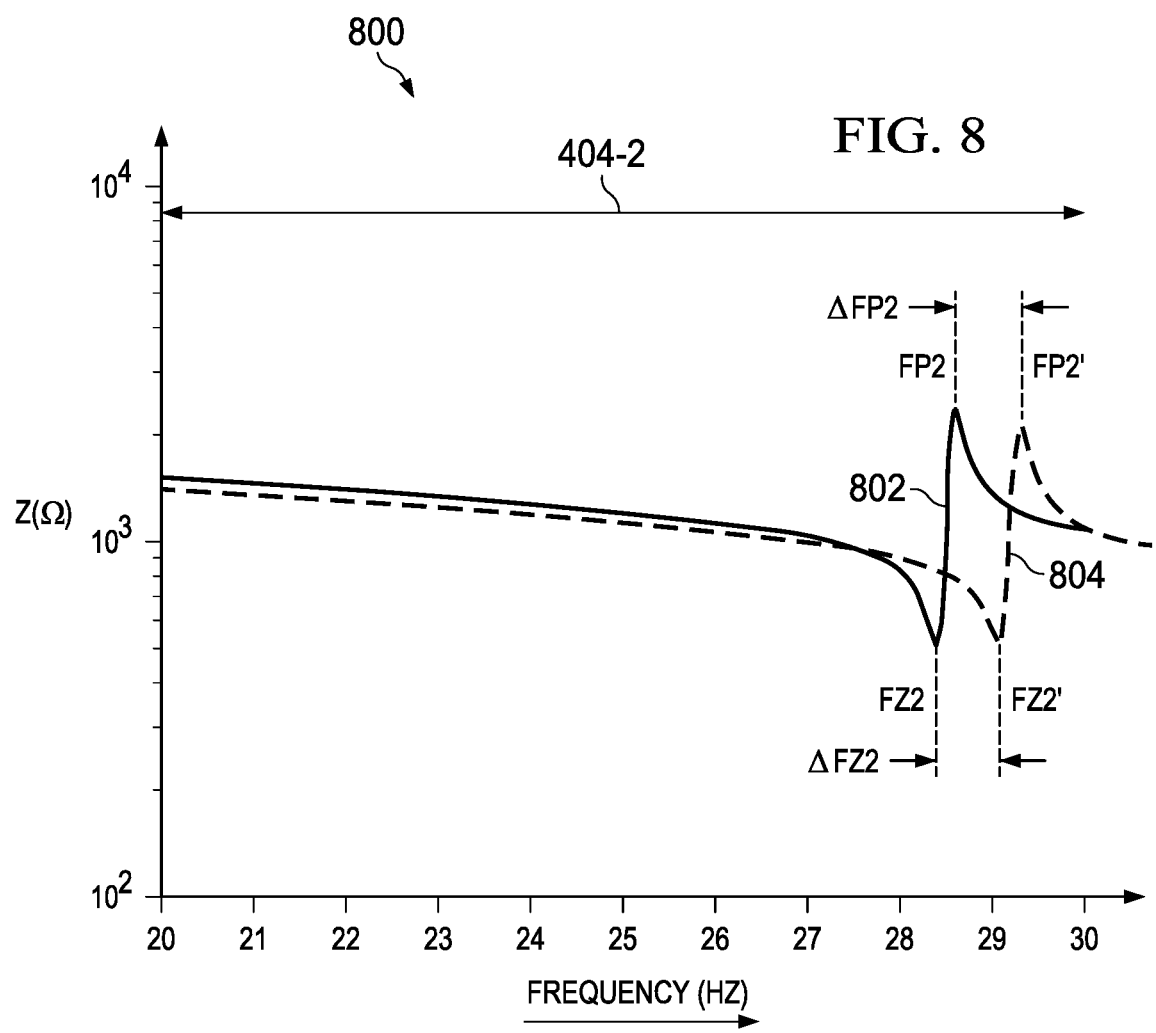

ULTRASONIC LENS CLEANING SYSTEM WITH IMPEDANCE MONITORING TO DETECT FAULTS OR DEGRADATION

Under 35 U.S.C. § 119, this application claims priority to, and the benefit of, U.S. Provisional Patent Application Ser. No. 62/415,554 that was filed on Nov. 1, 2016 and is entitled IMPEDANCE MONITORING TO DETECT FAILURES IN A LENS COVER SYSTEM, the entirety of which is incorporated by reference herein.

BACKGROUND

Camera systems are becoming more prevalent in automotive and other applications, such as vehicle cameras, security cameras, industrial automation systems, and in other applications and end-use systems. Operation of camera and lighting systems is facilitated by clean optical paths, which can be hindered by dirt, water or other debris, particularly in outdoor applications such as vehicle mounted camera systems, outdoor security camera systems, camera systems in industrial facilities, etc. In particular, camera or light source lenses may be subject to ambient weather conditions, dirt and debris, and other contaminants which can obstruct or interfere with optical transmission through the lens. Automatic lens cleaning systems (LCSs) have been developed for vehicle and security cameras to self-clean a lens or lens cover. Such systems may include air or water spray apparatus to wash a lens surface. Other lens cleaning systems electronically vibrate the lens to expel contaminants, water or other unwanted material from the lens cover to improve image quality or light transmission efficiency. In certain applications, the optical system and the lens cleaning apparatus may be subjected to mechanical stresses, thermal stresses and other adverse environmental conditions that can degrade the cleaning system components. For instance, a lens or lens cover may become cracked, a vibration transducer may fail, a seal structure may be compromised, an adhesive bond between the lens and a transducer may fail, or a number of other failures or degradation types may occur. In vehicle-based systems or other applications where a camera or light source cannot be conveniently accessed, it is desirable to maintain proper operation of the lens cleaning system to ensure continued optical transmission through a lens or lens cover.

SUMMARY

Disclosed examples include lens cleaning systems, drivers and methods to detect faults or degradation in a lens cleaning system, including a controller to control a lens transducer drive signal frequency to vibrate the lens in a frequency range of interest and measure frequency response values according to driver feedback signals and to compare the measured frequency response values to baseline frequency response values for a healthy system. The controller determines the existence of a fault or degradation in the lens cleaning system according to dissimilarities between the measured frequency response values and the baseline frequency response values at multiple frequencies. The frequency response can be measured as an impedance response, admittance response or other frequency domain equivalent. In this disclosure, the impedance response will be used to convey the concepts related to this invention.

In accordance with certain aspects of the disclosure, a lens cleaning system and a lens cleaning system driver are provided. The driver includes an output that provides an oscillating drive signal to a transducer to vibrate a lens and a feedback circuit that receives transducer voltage and current feedback signals. The driver further includes a controller that controls the frequency of the drive signal to vibrate the lens at frequencies in a frequency range of interest and determines measured frequency response values according to the current and voltage feedback signals. The controller compares the measured frequency response values to baseline frequency response values for a healthy lens cleaning system in the frequency range of interest and selectively determines the existence of a lens cleaning system fault or degradation according to dissimilarities between the measured frequency response values and the baseline frequency response values. The driver in certain examples provides an indication of a fault or degradation type based on analysis of multiple ranges of interest. In certain implementations, the controller operates in a second mode to measure and store a baseline impedance profile including frequency response values measured for the healthy lens cleaning system across a wide range of frequencies that includes the frequency range of interest, and the controller identifies one or more frequency ranges of interest that include a pole or zero of the baseline impedance profile.

Methods are provided for detecting lens cleaning system faults or degradation, which include controlling a drive signal frequency to vibrate a lens at a plurality of frequencies in a frequency range of interest, as well as determining measured frequency response values individually corresponding to one of the frequencies in the frequency range of interest. The method further includes comparing the measured frequency response values to baseline frequency response values in the frequency range of interest for a healthy lens cleaning system and selectively determining lens cleaning system faults or degradation according to dissimilarities between the measured frequency response values and the baseline frequency response values.

BRIEF DESCRIPTION OF THE DRAWINGS

FIG. 4 is a graph of an example impedance magnitude response curve as a function of excitation frequency.

FIG. 5 is a graph of an example impedance phase angle response curve as a function of excitation frequency.

FIG. 6 is a graph of example impedance magnitude response curves at different voltage amplitudes in a first range of frequencies for a healthy lens cleaning system.

FIG. 7 is a graph of example impedance magnitude response curves at different voltage amplitudes in the first range of frequencies for a lens cleaning system with a degraded or faulty transducer.

FIG. 8 is a graph of example impedance magnitude response curves at a given operating voltage in a second range of frequencies for a healthy lens cleaning system and a lens cleaning system with a degraded or faulty bond between the lens or lens cover and the transducer.

DETAILED DESCRIPTION

Figure 1:
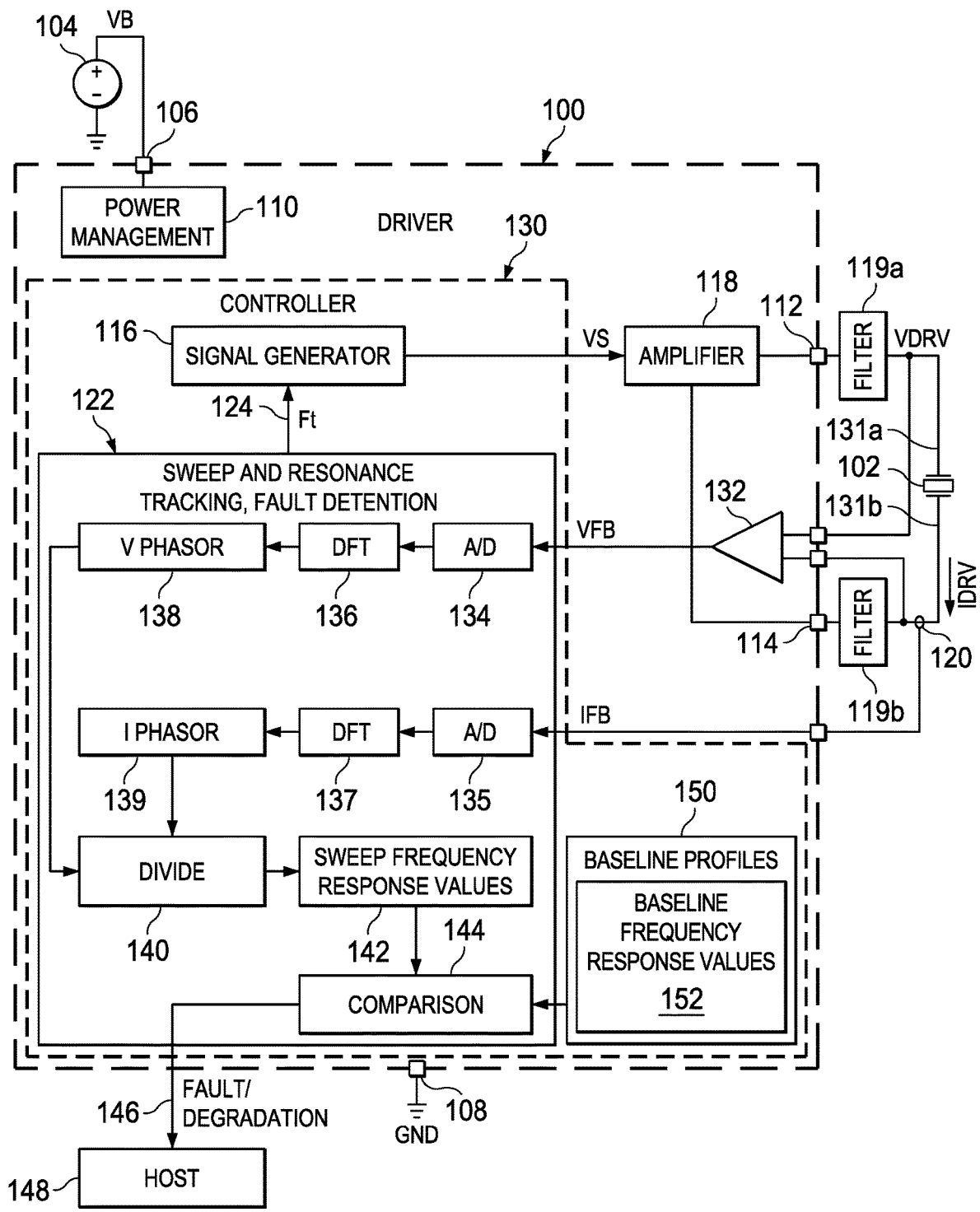
FIG. 1 is a schematic diagram of a lens cleaning system.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
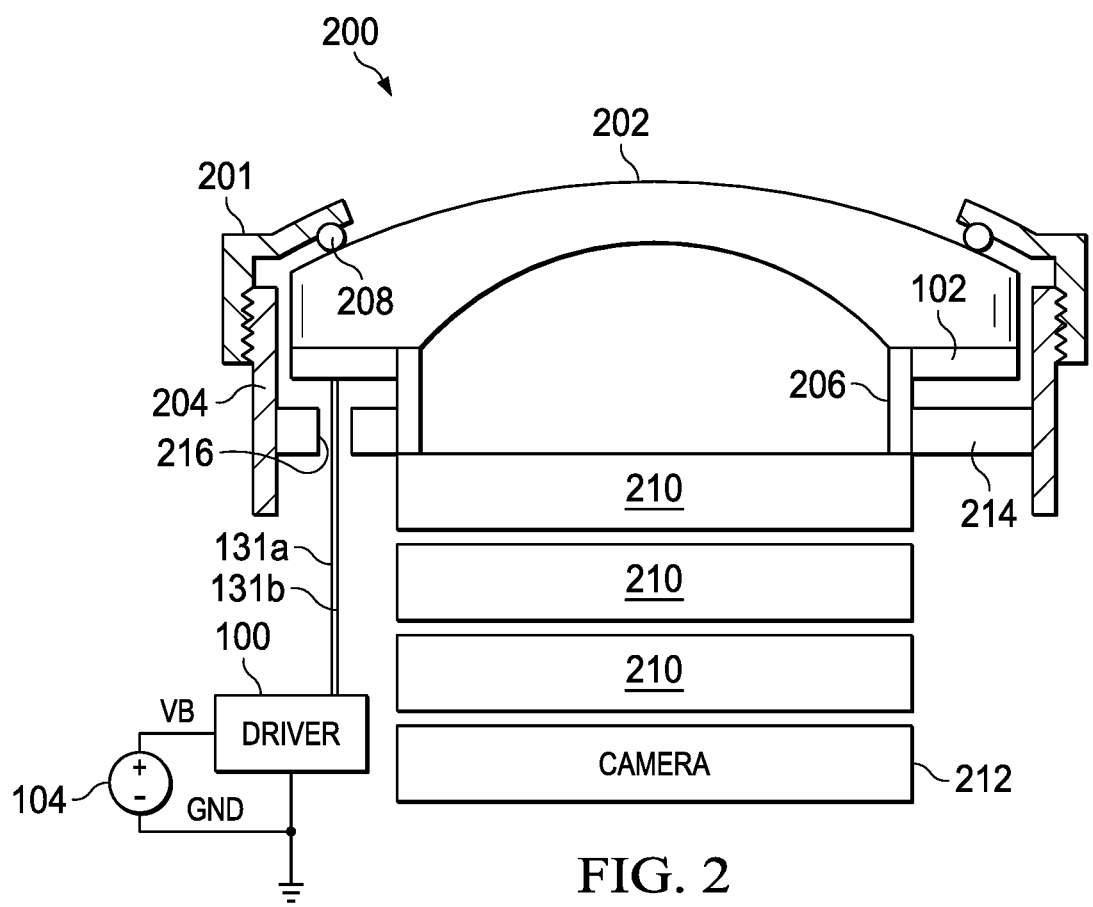
FIG. 2 is a partial sectional side elevation view of a camera lens assembly including a lens cleaning system.

Referring initially to FIGS. 1 and 2, FIG. 1 shows an ultrasonic lens cleaning system with a driver integrated circuit (IC) 100 and FIG. 2 shows a camera lens assembly 200 including an ultrasonic lens cleaning system. As seen in FIG. 2, the lens assembly 200 includes a cylindrical or "ring" transducer 102 which is mechanically coupled to vibrate a lens 202. In one example, the transducer 102 is glued to the lens 202. Although illustrated in the context of a camera lens system, various concepts of the present disclosure can also be used in lighting systems or other optical systems, with or without a camera. Disclosed apparatus and techniques facilitate automatic fault or degradation detection in lens cleaning systems using a controller and a transducer which can also be used for automatic lens cleaning operations. As used herein, a lens can be a focusing element or other lens that implements optical shaping or other optical effect to aid camera imaging, as well as a lens cover or optical window that merely provide protection for further optical elements without performing any imaging functions. Disclosed examples provide apparatus and techniques to assess the mechanical frequency response of the lens and associated mechanical structures based on one or more electrical feedback signals, which can include determining impedance values or admittance values across a plurality of frequencies to determine or infer frequency response values, as well as comparison of baseline and measured frequency response values.

The lens 202 in one example is a "fisheye" lens having a curved outer surface as shown in FIG. 2. In other examples, a flat lens or a lens having a different profile can be used. The lens assembly in this example is mounted to a generally cylindrical housing 204 using a cylindrical cap fastener 201 and is sealed using an O-ring 208 extending between an edge of the lens 202 and the fastener 201 to prevent ingress of water or debris into the interior of the housing 204. In one example, the housing 204 can be mounted to a motor vehicle to operate as lens cover for a rear backup camera, a forward-facing camera or a side-facing camera. In other examples, the assembly 200 can be mounted to a building or a light pole, for example, for security camera or lighting applications. In other examples, the assembly 200 can be used for interior security monitoring systems, such as within a commercial or residential building. In this example, a series of generally flat secondary lenses 210 are disposed within the inner surfaces of the spacer 206. The secondary lenses 210 and the fisheye lens 202 provide an optical path for imaging by a camera 212. The transducer 102 includes lead wires or terminals 131a and 131b that extend through an opening 216 in a base 214 of the housing 204 for connection with the driver IC 100. In the example of FIG. 2, the lens 202 is mounted into the cylindrical housing 204 with a cylindrical inner spacer structure 206. The transducer 102 in this example is a cylindrical ring-shaped piezo-electric transducer disposed between the inner spacer 206 and the outer wall of the housing 204.

As best shown in FIG. 1, the driver IC 100 includes a power input pin or pad 106 that receives input power from a power supply or power source 104, such as a battery providing a battery voltage signal VB with respect to a reference node 108 having a reference voltage (e.g., GND). The driver IC 100 includes a power management circuit 110 that receives the battery voltage signal VB and provides one or more supply voltages (not shown) to power the internal circuitry of the driver 100. In addition, the IC 100 includes an output with terminals 112 and 114 for connection to the lead wires 131a and 131b, respectively, of the transducer 102. In operation, the driver 100 output provides an oscillating drive signal VDRV at a non-zero frequency Ft to the transducer 102 to vibrate a lens 202. As discussed further below, the controlled vibration of the lens 202 via excitation of the transducer 102 facilitates cleaning or removal of contaminants or debris from the outer surface of the lens 202. In addition, the transducer 102 is controlled by the driver 100 in first and second modes for assessing the health of the lens cleaning system. In specific examples, the driver 100 can detect the existence of one or more faults or degradation in the lens cleaning system in a first mode. In a second mode, the driver 100 can characterize or calibrate a healthy system to determine one or more baseline profiles as discussed further below.

As shown in FIG. 1, the driver IC 100 includes a controller or control circuit 130 with a signal generator 116. In one example, the controller 130 is a processor with an associated electronic memory. The controller 130 implements various cleaning, fault or degradation detection, and optional calibration or baseline processing functions by controlling the oscillatory frequency Ft of the transducer 102. In one example, the controller 130 includes a sweep and resonance tracking, fault detection circuit 122 with an output 124 that provides a desired frequency Ft to a signal generator circuit 116. In another possible implementation, the controller 130 is implemented in a processor, such as a DSP or other programmable digital circuit, which implements sweep and resonance tracking as well as fault detection and calibration functions through execution of instructions stored in an associated memory to generate the frequency Ft as a digital value representing a desired frequency Ft of the drive signal VDRV. In one example, the signal generator 116 is a pulse width modulation (PWM) output of the processor that implements the controller 130. The signal generator circuit 116 provides an output signal VS that oscillates at a non-zero frequency Ft. In certain implementations, the controller 130 includes an integral electronic memory, or is operatively connected to an external electronic memory 150 that stores program instructions implemented by the processor, and stores baseline frequency response values 152, for example, baseline impedance values as discussed further below. The illustrated example employees impedance values 152 that represent the frequency response of the system. Other values can be used, such as admittance values or other values that represent the frequency response of the system.

The driver IC 100 further includes an amplifier 118 which amplifies the output signal VS to generate the oscillating drive signal VDRV. In this manner, the controller 130 provides the desired frequency Ft of the drive signal VDRV, and thereby controls the oscillatory frequency of the transducer 102 for cleaning the lens 202 and/or to implement calibration and fault/degradation detection functions as described herein. In one example, the amplifier 118 is a full H-bridge amplifier circuit with first and second outputs individually coupled with the transducer terminals 131a and 131b to provide the oscillating drive signal VDRV to the transducer 102. In the example of FIG. 1, moreover, an L-C filter circuit 119 is connected between the amplifier outputs and the transducer terminals 131a and 131b. In one possible implementation, the filter 119 includes a first filter circuit 119a connected between a first output of the amplifier 118 and the first transducer terminal 131a, as well as a second filter circuit 119b connected between the second output of the amplifier 118 and the second transducer terminal 131b. A variety of different signal generator circuits 116 can be used, including a PWM processor output that generates a square wave signal VS, or other signal generator circuitry to provide sinusoidal, triangular, saw tooth or other waveforms having a non-zero signal frequency Ft. In one example, the first output of the amplifier 118 delivers an oscillating drive signal to the transducer 102 and the second amplifier output delivers an oscillating drive signal to the transducer 102 which is 180 degrees out of phase with respect to the first output.

In certain examples, the amplifier 118 can provide a single ended output through the first filter circuit 119a to the first output terminal 112, and the return current from the transducer 102 flows through the second filter circuit 119b to return to the second output of the amplifier 118. In the illustrated example, the amplifier 118 provides a differential output to the filters 119a, 119b. In this case, the individual filter circuits 119a and 119b each include a series inductor and a capacitor connected between the second inductor terminal and a common reference voltage (e.g., GND) to deliver the amplified signal to the transducer 102. In this manner, the amplifier 118 amplifies the signal generator output signal VS and delivers an oscillating drive signal VDRV to the transducer 102. The filter circuit 119 advantageously allows the use of a square wave output from the PWM signal generator 116 to provide a generally sinusoidal oscillating signal VDRV to vibrate the transducer 102 and the mechanically coupled lens 202.

The driver IC 100 also includes a feedback circuit with a current sensor or current transducer 120 that generates a current feedback signal IFB representing a current IDRV flowing in the transducer 102. The feedback circuitry also includes a differential amplifier 132 with inputs connected to the transducer output terminals 112 and 114, as well as an amplifier output that generates a voltage feedback signal VFB representing the transducer voltage. The feedback signals IFB and VFB are provided to the controller 130. In one example, the controller 130 includes analog-to-digital (A/D) converters 134 and 135 to convert the current and voltage feedback signals IFB and VFB to digital values. In one possible implementation, the controller 130, the amplifier 118 and the feedback circuitry are fabricated in a single integrated circuit 100. The driver 100 can be provided on a single printed circuit board (PCB) along with a camera 212 (or a light source) to provide a compact solution for various vehicle-based and/or security camera systems for lighting systems generally.

The driver IC 100 operates in a normal mode to selectively provide ultrasonic lens cleaning functions in conjunction with the associated transducer 102. The outer surface of the lens 202 in FIG. 2 may be exposed to dirt, debris, water and other optical obstructions, referred to herein as contaminants, particularly in outdoor installations. The driver 100 provides an oscillating signal to cause the transducer 102 to vibrate the lens 202 to facilitate or promote cleaning of the lens 202. In one example, the driver 100 provides an ultrasonic drive signal or voltage waveform VDRV to actuate the transducer 102 and cause the transducer 102 to mechanically vibrate the lens 202 using ultrasonic waves to remove dirt and/or water from the surface of the lens 202. Mechanical oscillation or motion of the lens 202 at ultrasonic waves of a frequency at or close to a system resonant frequency can facilitate energy efficient removal of water, dirt and/or debris from the lens 202. The driver IC 100 in one example provides a closed loop system using the feedback signals IFB and/or VFB during lens cleaning operation. In one example, the driver IC 100 regulates operation at or near a local minima or maxima in a current or impedance signal value ascertained from current feedback signal IFB. In one example, the driver IC 100 regulates operation at or near the local minima or between the minima and the maxima. The controller in one example uses the converted values from the A/D converters 134 and/or 135 to implement closed-loop control in driving the transducer 102 for lens cleaning operations.

The controller 130 also operates in a first mode (e.g., DETECT mode in FIG. 3 below) for detecting degradation or faults in the lens cleaning system. As shown in FIG. 1, the analog feedback signals VFB and IFB are converted to digital values by the A/D converters 134 and 135. The controller 130 in one example calculates discrete Fourier transform (DFT) components 136 and 137 to respectively provide voltage and current phasor values 138 and 139 based on time domain digital voltage and current feedback values from the converters 134 and 135. The controller 130 also implements a complex division (DIVIDE) function 140 to compute sweep frequency response values, such as sweep impedance values 142 as the ratio of the voltage phasor value 138 to the current phasor value 139 for a given sample. In this regard, the A/D converters operate at a sufficiently high sample frequency to obtain a stream of digital values representing the feedback voltage and current associated with the driven transducer 102. The processing implemented by execution of program instructions by the processor of the controller 130 provides a stream of frequency response values (e.g., impedance values) 142.

In the degradation/fault detection operation in the first mode, the controller 130 controls the frequency Ft of the drive signal VDRV to vibrate the lens 202 at a plurality of frequencies in a frequency range of interest. In one implementation, the controller 130 performs a frequency sweep for one or more predetermined frequency ranges of interest. The controller 130 digitally converts the feedback signals during the frequency sweep, obtains frequency spectrum phasor information 138 and 139, and divides these values 140 to obtain sweep frequency response values 142 corresponding to the frequencies in the range of interest. The controller 130 also implements a comparison function 144 that compares the measured frequency response values 142 to baseline frequency response values 152 associated with corresponding ones of the plurality of frequencies in a given frequency range of interest for a healthy lens cleaning system. The controller 130 uses the comparison to selectively determine the existence of a fault in the system or degradation in the lens cleaning system according to dissimilarities between the measured frequency response values 142 and the baseline frequency response values 152. The controller 130 does not need to perform a continuous sweep, and instead controls the lens transducer drive signal frequency Ft to vibrate the lens 202 at one or more frequencies included in a predetermined frequency range of interest and computes the corresponding frequency response values 142 according to the driver feedback signals VFB, IFB.

The controller 130 compares the measured frequency response values 142 to corresponding baseline frequency response values 152 for a healthy system. The controller 130 selectively determines the existence of a fault or degradation in the lens cleaning system according to dissimilarities between the measured frequency response values 142 and the baseline frequency response values 152. In certain implementations, the controller 130 compares the difference between the measured and baseline values 142, 152 with a threshold to make an initial determination of whether or not the system is healthy. If a fault or degradation is determined (e.g., the difference exceeds a first threshold), the amount of the difference can be used to distinguish between suspected faults and suspected degradation for example, using a second threshold comparison. The controller 130 in one example includes an output 146 that selectively provides a signal FAULT/DEGRADATION to a host system 148 in response to determination of the existence of a fault or degradation. This architecture facilitates appropriate remedial action by the host system. For example, in a vehicle-mounted driving assistance application, automated vehicle control systems that use a camera output for vehicle navigation, braking control, steering control, driver warnings, etc. can be automatically notified by the driver IC 100 that the lens cleaning system is degraded or faulty.

In one example, the controller 130 is further operable in a second mode (e.g., BASELINE mode in FIG. 3 below). The second mode can be used to calibrate a known healthy system by characterizing the frequency response of the healthy system as one or more baseline profiles. In one example, the controller 130 measures one or more baseline frequency response profiles, such as impedance profiles (e.g., profiles in the memory 150 in FIG. 1). The individual baseline profiles include frequency response values 152 measured for the healthy lens cleaning system across a wide range of frequencies that includes one or more frequency ranges of interest. The controller 130 stores the baseline impedance profile or profiles in the memory 150 of the lens cleaning system, and identifies one or more frequency ranges of interest that include a pole FP or zero FZ of the baseline impedance profile as discussed further below in connection with FIGS. 4 and 5.

In certain examples, the controller 130 determines one or more baseline profiles for each of a plurality of different transducer voltages, and stores these multiple baseline frequency response profiles in the memory of the lens cleaner system. In these examples, the controller 130 operates in the first (DETECT) mode for each of a plurality of different transducer voltages to drive the transducer 102 in order to vibrate the lens 202 at frequencies in a predetermined range of interest for the corresponding transducer voltage. In this case, the controller 130 determines measured frequency response values 142 that individually correspond to one of the plurality of frequencies in the predetermined frequency range of interest according to the current feedback signal IFB and the voltage feedback signal VFB. The controller 130 compares the measured frequency response values to the corresponding baseline frequency response values 152 in the predetermined frequency range of interest for the corresponding transducer voltage. The controller 130 selectively determines existence of a fault or degradation according to dissimilarities identified in the comparison. In this regard, the normal cleaning operation of the system can operate at certain transducer voltages tailored to removing contaminants from the lens 202, whereas the fault or degradation detection operations of the system may be performed at these voltages and/or at different (e.g., lower) voltages tailored to detecting the existence of one or more failures or faults in the system while potentially reducing power consumption. This architecture is particularly advantageous where the lens cleaning system operates from a battery power source 104 and is also advantageous in terms of reducing thermal stress on the transducer.

In certain implementations, moreover, the controller 130 selectively identifies a particular determined fault or degradation type according a specific frequency range of interest for which the dissimilarities indicate existence of the fault or degradation. In this manner, the driver 100 can selectively issue a FAULT/DEGRADATION signal to the host system 148 to initially indicate that there is degradation or a fault in the lens cleaning system, and also optionally identify the fault type according to particular dissimilarities. Such implementations facilitate providing advanced information to the host system 148 to indicate a particular fault or degradation type based on impedance response or more generally on frequency response. Such discernible types can include lens cracking or breaking, transducer cracking or depolarization, seal failure, glue failure, etc. The disclosed examples thus facilitate identification of when a failure has occurred in the lens cover system, as well as identification of failure type and the controller 130 and/or the host system 148 can provide appropriate corrective or remedial action. This design, in turn, facilitates improved readiness and availability of the lens cleaning system, by proactively identifying failure and allowing replacement of faulty or degrading system components so that system is operational at high availability.

Referring now to FIGS. 3-8, FIG. 3 illustrates a process or method 300 of detecting and identifying lens cleaning system degradation or faults. The method 300 can be implemented in certain examples by a controller or processor, such as the lens cleaning system driver controller 130 described above. The process 300 includes an initial calibration or baseline establishment mode ("BASELINE" mode in FIG. 3) at 302 and 304 to establish the baseline profiles 150 and corresponding baseline frequency response values 152 stored in the memory of the controller 130 of FIG. 1 when the associated lens cleaning system is known to be operational or "healthy". A healthy system, for example, has no known faults or degradation of the system components including the transducer 102, the mechanical structure (FIG. 2) including the mechanical coupling of the transducer 102 with the corresponding lens 202, the mounting of the lens 202 and/or the transducer 102 in the housing 204, the structural integrity and positioning of the seal structure 208, etc. At 306-316, the system is operated in a detection mode ("DETECT" mode in FIG. 3) to selectively detect and optionally identify lens cleaning system degradation and/or faults.

Figure 3:
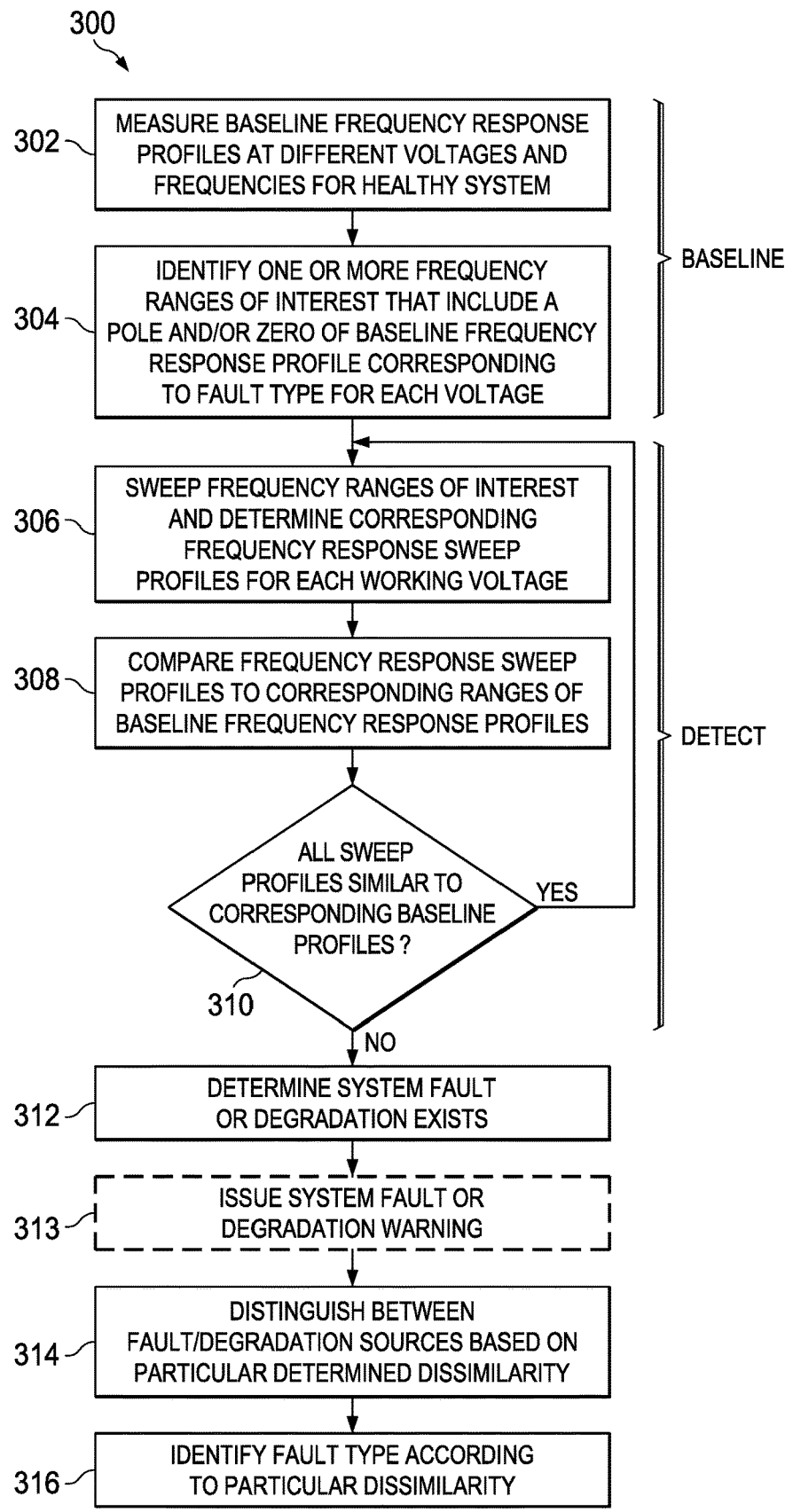
FIG. 3 is a flow diagram of an example process or method of detecting and identifying lens cleaning system degradation or faults.

Operation in the BASELINE mode begins at 302 in FIG. 3, where the controller 130 measures baseline frequency response profiles at different voltages and frequencies for a healthy system and preferably stores these profiles in non-volatile storage such as FLASH, EPROM, etc. In one example, this design includes controlling the transducer drive signal frequency Ft to vibrate the lens 202 at a plurality of frequencies over a wide frequency range, while measuring sampled current and voltage values to determine (e.g., compute) frequency response values 152. As discussed above, this approach can be implemented as a continuous frequency sweep by control of the frequency Ft (e.g., upward or downward throughout a wide frequency range), or by selective operation at discrete frequencies throughout the wide frequency range in any suitable sequence. In one example, the baseline frequency response profiles are measured or otherwise established at 302 for a plurality of transducer voltages. The controller 130 then analyzes the resulting frequency response profiles at 304 to identify one or more frequency ranges of interest that include a pole or zero corresponding to a given fault type for each transducer voltage. A correspondence between a given degradation/fault type and one or more specific frequency ranges of interest for a corresponding transducer voltage can be established before-hand, for instance, based on empirical testing, factory manufacturing testing, or any other suitable analysis or data source.

FIG. 4 provides a graph 400 that illustrates an example impedance magnitude response curve 402 as a function of transducer excitation frequency over a wide range 403, such as 10 to 1000 kHz in one non-limiting implementation. Other ranges may be used, preferably covering a usable range depending on the various masses of the structural components used in the optical system generally and the lens cleaning system in particular. FIG. 5 provides a corresponding graph 500 showing an example phase angle response curve 502 as a function of transducer excitation frequency over the same wide frequency range 403. In this example, the impedance curve 402 includes a number of local maxima corresponding to poles of the mechanical system, as well as a number of local minima corresponding to system zeros. A local maxima of the phase curve 502 is at the geometric mean between the pole and zero frequencies of the impedance curve 402. The graphs 400 and 500 depict several distinct frequency ranges having corresponding poles FP and zeros FZ, including a first identified frequency range of interest 404-1 having a pole FP1 and a zero FZ1, as well as a second identified frequency range of interest 404-2 that includes a pole FP2 and a zero FZ2.

The inventors have appreciated that faults and/or degradation of one or more components or aspects of the lens cleaning system can cause changes in the frequency spectrum of the impedance curve 402 and/or the phase spectrum curve 502. Disclosed systems and methods provide for automatically analyzing specific frequency ranges of interest 404 in order to ascertain the existence of one or more faults or degradation of the system. The disclosed examples, moreover, use the system components that are already present for cleaning purposes. The controller 130 in certain examples also implements calibration or "BASELINE" operation to characterize or calibrate the system with respect to a known or believed healthy system at 302 and 304. In one example at 304, the controller identifies one or more frequency ranges of interest that include a pole or zero of the baseline impedance profile that corresponds with an associated fault type or degradation type. In addition, as previously discussed, this characterization can be done at multiple operating voltages to establish baseline profiles for each operating voltage, and to identify one or more frequency ranges of interest for each baseline profile 150. In the example of FIGS. 4 and 5, the system controller 130 identifies the first and second ranges of interest 404-1 and 404-2 as corresponding with distinct fault or degradation types. In this example, the first frequency range of interest 404-1 is indicative of depolarization of the transducer 102, and the second frequency range of interest 404-2 is associated with faulty bonding between the lens or lens cover 202 and the transducer 102 in the system of FIG. 2. Further fault-specific frequency ranges of interest 404 can be determined by the controller 130 at 304. This flexibility allows separate analysis and fault identification among multiple fault types, and accordingly facilitates advanced diagnostic information that can be provided to a host system 148 (FIG. 1) by the controller 130. The controller 130 in this example identifies relationships between faults or degradation and behavior of corresponding resonances in the mechanical system constituted by the lens cleaning system components.

Continuing in FIG. 3, the controller 130 operates in the "DETECT" mode at 306-310. At 306, the controller 130 controls the frequency Ft of the drive signal VDRV to vibrate the lens 202 at a plurality of frequencies in a frequency range of interest 404. In one example, the controller 130 sweeps the frequency Ft through the frequency range of interest 404. In other examples, the controller 130 operates the transducer 102 at multiple distinct frequencies Ft within the range of interest 404, where continuous sweeping is not a strict requirement of all possible implementations. At 306, the controller 130 also determines measured frequency response values 142 that individually correspond to one of the frequencies in the frequency range of interest 404 according to the current and voltage feedback signals IFB and VFB. As previously described, the controller 130 uses one or more suitable techniques (e.g., DFT operations, divide operations, etc.) to determine corresponding impedance sweep profiles for each of two or more working voltages at 306. Although the illustrated method 300 involves baseline correlation and fault/degradation detection at multiple operating transducer voltages, other implementations are possible in which the steps are done for only a single voltage.

At 308 in FIG. 3, the controller 130 compares the impedance sweep profile or profiles corresponding to one or more frequency ranges of interest 404 with corresponding baseline frequency response values 152 of the corresponding baseline profile or profiles in the memory 150. The controller 130 determines at 310 whether all the sweep profiles are similar to the corresponding baseline profiles. Similarity or dissimilarity can be established by any suitable comparison technique at 308 and 310. Mathematical techniques can be implemented by the controller 130. For example, a correlation function can be evaluated to determine whether a certain amount of dissimilarity is present, in which case the controller 130 provides the FAULT/DEGRADATION signal at the output 146 to alert the host system 148 that a fault or degradation has been detected.

In another example, the controller 130 computes a sum of squares difference value based on the comparison, and selectively determines the existence of a fault or degradation in the lens cleaning system if the difference value exceeds a predetermined threshold. In certain examples, different thresholds can be used for different profiles and comparisons, with a specific threshold being used for each frequency range of interest, and for each operating transducer voltage. In one example, the controller 130 computes a root-mean-square (RMS) difference between the baseline and sweep frequency response values at the measured points, and compares this value with a corresponding threshold. If the controller 130 determines that all of the sweep profiles are similar to the corresponding baseline profiles (YES at 310), the process 300 returns to 306 as previously described.

The detection mode processing can be implemented at any suitable time in a normal operational implementation of a system. For example, a lens cleaning system may be instantiated or started according to a schedule established by the host system 148, such as periodic cleaning. The controller 130 in one example implements the fault/degradation detection operation at 306-310 is a prelude to actual cleaning. If the system is determined to be operational (e.g., no identified or determined faults or degradation), the controller 130 drives the transducer 102 in order to implement lens cleaning according to any suitable transducer drive parameters (e.g., voltage, frequency, duration, etc.) after the positive determination (YES at 310). The next time the lens cleaning system is actuated by the host system 148, the process is repeated.

If a threshold amount of dissimilarity is determined by the controller 130 in one or more of the frequency ranges 404 of interest (NO at 310), the process 300 continues at 312 where the controller 130 determines that a system fault or degradation exists. In certain examples, the controller 130 issues a system fault or degradation warning (e.g., provides the FAULT/DEGRADATION signal to the host system 148) at 313 in FIG. 3. In certain examples, moreover, the controller 130 evaluates multiple frequency ranges of interest 404 (e.g., the ranges 404-1 and 404-2 in FIGS. 4 and 5). In this case, the controller 130 distinguishes between faults/degradation sources by selectively identifying a fault or degradation type at 314 according the specific one of the frequency ranges of interest 404 for which the dissimilarities indicate existence of the fault or degradation. The controller 130 can then selectively identify fault type according to the particular dissimilarity at 316. In addition, the controller 130 can implement one or more remedial or safety actions in response to detection of a system fault or degradation. For instance, the controller 130 can prevent further operation (e.g., cleaning) of the system pending repair or replacement of faulty or degraded components. Alternatively, the controller 130 can continue operation, particularly if only slight degradation is detected. For example, the lens cleaning system may be part of a vehicle-based camera system used in conjunction with one or more vehicle control actuators, and complete shutdown of the camera system may be unnecessary or inappropriate until the vehicle is stopped or a driver is alerted that automatic control functions are not available. In this case, the controller 130 can issue an alert to the host system 148 even though the cleaning operation is continued. In one possible implementation, the controller 130 can issue an alert to the host system 148 upon determination that system degradation exists, and then continue operation of the lens cleaning system until a determination is made that the system includes a fault, whereupon the controller 130 can prevent further cleaning operation of the system.

FIGS. 6-8 illustrate example graphs to further illustrate operation of the controller 130 in for selectively identifying faults and/or degradation of the system components. A graph 600 in FIG. 6 shows example impedance magnitude response curves 602, 604, 606 and 608 at different operating voltages in the first frequency range of interest 404-1 of FIGS. 4 and 5 for a healthy lens cleaning system. In this example, the range of interest 404-1 extends from approximately 280 kHz through 320 kHz, including zeros around 285 kHz-298 kHz and poles around 305 kHz-315 kHz for different transducer operating voltages. In particular, the curve 602 shows the impedance magnitude response of a healthy cleaning system at an input voltage of 20 V; the curve 604 shows the impedance magnitude response of a healthy cleaning system at an input voltage of 40 V; the curve 606 shows the impedance magnitude response of a healthy cleaning system at an input voltage of 60 V; and the curve 608 shows the impedance magnitude response of the healthy lens cleaning system at an input voltage of 80 V.

FIG. 7 provides a graph 700 showing example impedance magnitude response curves 702, 704 and 708 corresponding to transducer operating voltages of 20 V, 40 V and 80 V in the system corresponding to FIG. 6 after the transducer 102 has been subjected to transducer depolarization degradation or fault. As with FIG. 6, the curves 702, 704 and 708 in the graph 700 of FIG. 7 illustrates the impedance magnitude response of the system at the corresponding transducer voltages over the first frequency range of interest 404-1 (e.g., 280-320 kHz). With respect to the illustrated 20 V transducer voltage curve 702, both the pole and zero locations have changed due to the faulty or degraded (e.g., depolarized) transducer 102. The curve 702 in this example exhibits a local maxima or pole FP1' that is shifted by a change amount AFP1 (e.g., approximately 2-3 kHz) relative to the healthy system pole location FP1 in FIG. 6. Also, the 20 V curve 702 in FIG. 7 exhibits a relatively weak local minima or zero FZ1' that is shifted by a change amount AFZ1 (e.g., approximately 5 kHz) relative to the healthy system zero location FZ1. In addition, the corresponding 20 V curves 602 and 702 in FIGS. 6 and 7 have significantly different shapes across the frequency range of interest 404-1. The same is true of the 40 V curves 604 and 704 as well as the comparative 80 V curves 608 and 708 in FIGS. 6 and 7. As previously mentioned, RMS or sum of squares type analysis can be performed on the corresponding curve pairs by the controller 130 in order to provide a value indicating the similarity or dissimilarity of the sweep frequency response profiles 702, 704, 708 with respect to the baseline profiles 602, 604, 608. FIGS. 6 and 7 illustrate a frequency shift-based similarity comparison technique which can also be used, in which a local minima or local maxima is identified in the sweep profile and its corresponding frequency is compared with a corresponding local maxima or minima to determine a frequency change value ΔF. A fault or degradation can be detected based on the magnitude of the value ΔF. This fault or degradation can result from transducer overheating beyond the Curie temperature when too much current is driven thru the device during the cleaning process, leading to depolarization of the transducer piezoelectric material. This condition can result from the transducer being excited at different resonant frequencies with a fixed voltage level, where the transducer electrical impedance can change by an order of magnitude across the resonances of interest. In this example, the zero near 290 kHz no longer has a resonant effect when the voltage level increases to the required level to excite the transducer (e.g., the 40 and 80 V curves 704 and 708). The disclosed systems facilitate monitoring the impedance response of the transducer 102 periodically or at any suitable point during the life of the transducer 102. If the response indicates that the resonant frequency is no longer present, then the transducer is determined by the controller 130 to be degraded or faulted, and a suitable warning signal or message can be issued to the host system 148.

FIG. 8 provides a graph 800 showing a further example implemented with respect to the second identified frequency range of interest 404-2 discussed above. In this case, the controller 130 has previously determined that this frequency range of interest 404-2 is relevant to detection of faults or degradation in a bond (e.g., glue) between the lens 202 and the transducer 102 of the lens cleaning system. The graph 800 includes a first curve 802 representing impedance magnitude response operation of the healthy system at a given operating voltage across the second example frequency range of interest 404-2 (e.g., 20-30 kHz). In this case, the healthy system exhibits a pole FP2 (e.g., slightly above 29 kHz) as well as a healthy system zero FZ2 at approximately 28 kHz. A second curve 804 in FIG. 8 shows subsequent impedance magnitude response throughout the range of interest 404-2 for a degraded or faulty bond between the lens 202 and the transducer 102. In this case, the pole location has changed by an amount AFP2 to a new location FP2', and the zero location has shifted by an amount AFZ2 to a new location FZ2'. The controller 130 in one example implements one or more numerical computations and mathematical techniques to ascertain a dissimilarity value or amount relating to the shapes of the curves 802, 804, and/or according to the frequency shift or shifts AFP2 and/or AFZ2. The amount of dissimilarity is compared with a corresponding threshold for the given transducer voltage used in the initial baseline characterization and the detection sweep in order to selectively determine the existence (or lack thereof) of a fault or degradation in the lens cleaning system.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A method, comprising:
   providing an oscillating drive signal from a driver to a transducer, the transducer mechanically coupled to a lens within a lens assembly;
   controlling a frequency of the drive signal to cause the transducer to vibrate the lens at first and second frequencies within a frequency range;
   while vibrating the lens at the first frequency, measuring first currents through the transducer, measuring first voltages across the transducer, and determining a first frequency response value responsive to the first measured currents and the first measured voltages;
   while vibrating the lens at the second frequency, measuring second currents through the transducer, measuring second voltages across the transducer, and determining a second frequency response value responsive to the second measured currents and the second measured voltages;
   in a first comparison, determining whether a first dissimilarity exists between the first frequency response value and a first baseline frequency response value of a baseline lens assembly; and
   in a second comparison, determining whether a second dissimilarity exists between the second frequency response value and a second baseline frequency response value of the baseline lens assembly; and
   determining existence of a degradation in the lens assembly responsive to the first and second comparisons, in which the degradation is a crack or break in the lens, a depolarization or crack in the transducer, a failure of a seal in the lens assembly, or a failure of a glue in the lens assembly.

2. The method of claim 1, further comprising:
   identifying a type of the degradation responsive to the first and second comparisons.

3. The method of claim 1, further comprising:
   using a controller, measuring a baseline frequency response profile including frequency response values measured for the baseline lens assembly across multiple frequencies;
   using the controller, storing the baseline frequency response profile; and
   using the controller, identifying the frequency range responsive to a pole or zero of the baseline frequency response profile.

4. The method of claim 1, further comprising: using a controller, providing a signal responsive to determining the existence of the degradation.

5. The method of claim 2, wherein:
   providing the oscillating drive signal includes:
      providing an output signal that oscillates at a non-zero frequency, from a signal generator circuit to the driver, responsive to a frequency control signal, and
      with an amplifier of the driver, amplifying the output signal to provide the oscillating drive signal to the transducer; and
   controlling the frequency of the drive signal includes providing the frequency control signal from a controller to the signal generator circuit.

6. The method of claim 2, wherein identifying the type of the degradation includes:
   identifying the type of the degradation responsive to whether the first dissimilarity exists instead of the second dissimilarity.

7. The method of claim 2, further comprising: using a controller, providing a signal responsive to determining the existence of the degradation.

8. The method of claim 3, wherein measuring the baseline frequency response profile includes:
   measuring the frequency response values for the baseline lens assembly across the multiple frequencies for a transducer voltage.

9. The method of claim 5, further comprising:
   using the controller, measuring a baseline frequency response profile including frequency response values measured for the baseline lens assembly across multiple frequencies;
   using the controller, storing the baseline frequency response profile; and
   using the controller, identifying the frequency range responsive to a pole or zero of the baseline frequency response profile.

10. The method of claim 8, wherein the transducer voltage is a first transducer voltage, and measuring the baseline frequency response profile includes:
    measuring the frequency response values for the baseline lens assembly across the multiple frequencies for a second transducer voltage.

11. The method of claim 9, wherein measuring the baseline frequency response profile includes:
    measuring the frequency response values for the baseline lens assembly across the multiple frequencies for a transducer voltage.

12. The method of claim 10, further comprising:
    identifying a type of the degradation responsive to whether the first dissimilarity exists instead of the second dissimilarity.

13. The method of claim 11, wherein the transducer voltage is a first transducer voltage, and measuring the baseline frequency response profile includes:
    measuring the frequency response values for the baseline lens assembly across the multiple frequencies for a second transducer voltage.

* * * * *